United States Patent
Brockmeier et al.

(10) Patent No.: US 9,428,381 B2
(45) Date of Patent: Aug. 30, 2016

(54) DEVICES WITH THINNED WAFER

(71) Applicant: Infineon Technologies AG, Neubiberg (DE)

(72) Inventors: Andre Brockmeier, Villach (AT); Christian Griessler, Villach (AT); Katharina Maier, Villach (AT); Peter Zorn, Villach (AT); Kai-Alexander Schreiber, Villach (AT); Francesco Solazzi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 14/194,912

(22) Filed: Mar. 3, 2014

(65) Prior Publication Data

US 2015/0246809 A1 Sep. 3, 2015

(51) Int. Cl.
| | |
|---|---|
| *B81C 1/00* | (2006.01) |
| *B32B 37/00* | (2006.01) |
| *B32B 38/08* | (2006.01) |
| *B32B 38/10* | (2006.01) |
| *B81B 7/00* | (2006.01) |
| *B81C 99/00* | (2010.01) |

(52) U.S. Cl.
CPC ....... *B81C 1/00357* (2013.01); *B32B 37/0046* (2013.01); *B32B 38/08* (2013.01); *B32B 38/10* (2013.01); *B81B 7/008* (2013.01); *B81C 1/0015* (2013.01); *B81C 1/00238* (2013.01); *B81C 99/0005* (2013.01); *B32B 2457/14* (2013.01); *B81C 2001/00452* (2013.01); *B81C 2201/014* (2013.01); *B81C 2203/0109* (2013.01); *B81C 2203/0735* (2013.01); *Y10T 156/15* (2015.01)

(58) Field of Classification Search
None
See application file for complete search history.

(56) References Cited

U.S. PATENT DOCUMENTS

| | | | | |
|---|---|---|---|---|
| 6,507,113 B1* | 1/2003 | Fillion | ............ | H01L 23/49811 257/40 |
| 2004/0081391 A1* | 4/2004 | Ko | ........ | B81B 3/0062 385/18 |
| 2006/0014358 A1* | 1/2006 | Sawyer | ............... | B81C 1/00182 438/412 |
| 2013/0193527 A1 | 8/2013 | Chu et al. | | |

* cited by examiner

*Primary Examiner* — Kimberly Rizkallah
*Assistant Examiner* — Bo Bin Jang
(74) *Attorney, Agent, or Firm* — Eschweiler & Associates, LLC

(57) ABSTRACT

Methods, apparatuses and devices are described where a main wafer is irreversibly bonded to a carrier wafer and thinned to reduce a thickness of the main wafer, for example down to a thickness of 300 μm or below.

11 Claims, 6 Drawing Sheets

DEVICES WITH THINNED WAFER

FIELD

The present application relates to methods and apparatuses for manufacturing devices, for example micro-electromechanical systems (MEMS), and to corresponding devices.

BACKGROUND

Micro-electro-mechanical systems are generally manufactured by forming mechanical structures in a wafer, typically a semiconductor wafer like a silicon wafer. Electrical structures may be formed on the same wafer. In order to decrease the volume of such micro-electro-mechanical systems, it would be desirable to reduce the thickness of the structured MEMS wafer. However, thicknesses below about 400 μm are difficult to obtain due to stability problems.

In other fields of technology than manufacturing MEMS, for processing thinned wafers the wafers may be mounted to a carrier using for example a glue or adhesive and released from the carrier after processing. However, at least for some kinds of micro-electro-mechanical systems, this may not be feasible as the wafer may be structurally weakened due to the formation of the mechanical structures. This in turn may lead to damages to the wafer when the wafer is released from the carrier.

BRIEF DESCRIPTION OF THE DRAWINGS

Illustrative examples of embodiments will be described with reference to the attached drawings in the detailed description that will follow.

DETAILED DESCRIPTION

Figure 1:
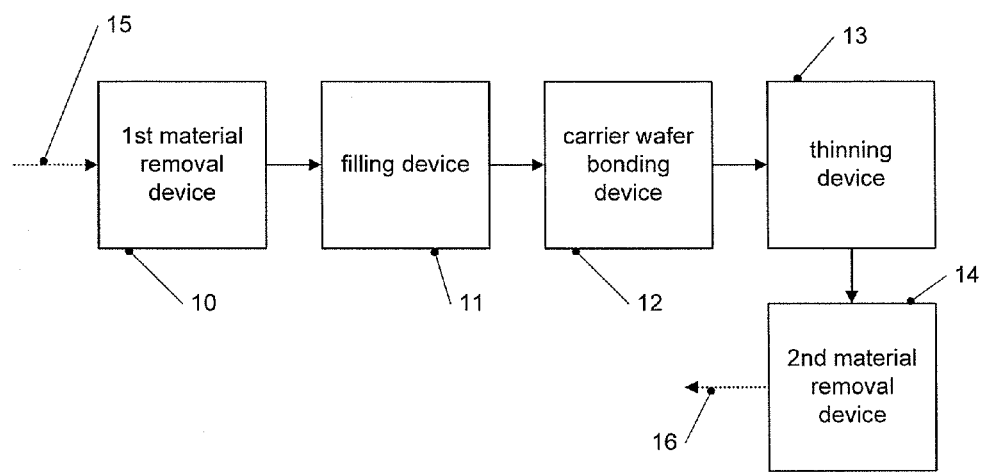
FIG. 1 is a block diagram of an apparatus according to an embodiment.

In the following, various illustrative embodiments will be described in detail. It is to be understood that these embodiments serve as examples only and are not to be construed as limiting the scope of the present application. For example, while embodiments may be described as comprising a plurality of features or elements, in other embodiments some of these features or elements may be omitted and/or replaced by alternative features or elements. Additionally or alternatively, in some embodiments additional features or elements apart from the ones explicitly described may be provided. Moreover, while some specific examples for micro-electromechanical systems will be given to provide a clearer understanding, it is to be noted that techniques disclosed herein may also be applicable to other micro-electro-mechanical systems or of the devices, for example electronic devices.

In the following, the terms "wafer" and "substrate" may be used interchangeable to refer to pieces of plate-like material. The material is essentially arbitrary and may for example comprise glass or a semiconductor like silicon. Wafers or substrates may be processed or unprocessed. Processing of a wafer may comprise modifying the form of the substrate, for example by etching, forming devices, for example semiconductor devices, on or in the substrate, modifying a doping of the substrate or providing layers like oxide layers or metal layers on or in the substrate. According to some embodiments, a micro-electro-mechanical system is provided comprising a processed wafer implementing the functionality of the micro-electro-mechanical system, a thickness of this wafer being below 300 μm, for example below 100 μm, for example below 50 μm. The wafer in which at least the greatest part of the structures relevant to the functioning of the micro-electro-mechanical system are formed will also be referred to as "main wafer" in the following. The main wafer may be irreversibly bonded to a first carrier wafer on one side thereof. In some embodiments, additionally, the semiconductor wafer may be irreversibly bonded to a second carrier wafer on another side thereof. The first and/or second carrier wafers may for example be made of glass. In other embodiments, other materials may be used for the first and/or second carrier wafers, for example silicon (Si), germanium (Ge), a silicon germanium crystal (SiGe), silicon carbide (SiC), gallium arsenide (GaAs), gallium nitride (GaN) or another type of III-V semiconductor. In embodiments, the material of the first and/or second carrier wafers may be selected to have a thermal expansion coefficient similar to a thermal expansion coefficient of the main wafer.

"Irreversibly bonded" in the context of the present application may indicate that it is essentially impossible to release the bonding in a non-destructive manner. This is in contrast for example to a bonding of a wafer to a carrier using glue or adhesive, which may be dissolved e.g. by irradiation with ultraviolet (UV) light, applying an increased temperature or applying a solvent, thus reversing the bonding basically without destroying or damaging anything on the wafer.

In some embodiments, such a micro-electro-mechanical system may be formed by irreversibly bonding a preprocessed wafer as main wafer to a carrier wafer like a glass wafer, followed by a thinning and a formation of structures, in particular mechanical structures or cavities, in the semiconductor wafer. In other embodiments, other wafers than semiconductor wafers may be used.

The above embodiments give only a short overview of some features of some embodiments and are not to be construed as limiting.

In FIG. 1, a schematic block diagram of an apparatus according to an embodiment for manufacturing a micro-electro-mechanical system is shown. The term "apparatus" in this respect is not to be construed as indicating any spatial configuration of the apparatus. In particular, the apparatus will be described as comprising a plurality of different devices for carrying out different types of processing. These devices need not be located close to each other, but may also be located remote from each other, for example in different rooms, buildings or even in different locations, as long as wafers may be transported from one device to the next in an appropriate manner, for example without inducing unwanted contaminations. Furthermore, while individual devices are shown as blocks, they may consist of several sub-devices which also need not be located close to each other. Furthermore, some of the devices may share components or may be implemented in a single device.

As indicated by arrows 15 and 16 in FIG. 1, prior to being processed by devices 10 to 14 shown in FIG. 1, and after being processed by devices 10 to 14, substrates and wafers my be processed by further (not shown) devices, which may be any kind of devices conventionally used for processing of wafers and substrates. In some embodiments, also between devices 10 to 14 other devices (not shown) to provide some conventional processing may be provided.

In the embodiment of FIG. 1, a wafer (main wafer) which may have undergone previous processing is provided to a first material removal device 10. In first material removal device 10, some material may be selectively removed from the main wafer, for example at locations where an opening or space reaching through the complete wafer is to be formed later. For example, material of an epitaxial layer (epilayer) and/or of an oxide layer may be removed.

In some embodiments, the main wafer may be a semiconductor wafer.

After having been processed by the first material removal device 10, in the embodiment of FIG. 1 the main wafer is forwarded to a filling device 11. In filling device 11, voids or gaps left by the removal of material in first material removal device 10 may be filled with a filling material. In some embodiments, as filling material a material removable by a dry process, for example a carbon-based material, removable by e.g. an oxygen ($O_2$) plasma, may be used. In embodiments where no opening through the complete main wafer has to be formed, devices 10 and 11 may be omitted.

After the filling performed by filling device 11, the wafer is provided to a carrier wafer bonding device 12. In carrier wafer bonding device 12, a carrier wafer, for example a glass wafer, which may be structured, is bonded to the main wafer, for example at a side where material was removed in first material removal device 10 and filled in filling device 11 (e.g. a front side). The bonding may be an irreversible bonding, for example, an anodic bonding or a hermetic bonding via ceramic adhesives or glass solder.

Next, the main wafer together with the bonded carrier wafer is fed to a thinning device 13, where the main wafer is thinned, for example to a thickness below 300 µm, below 100 µm, below 50 µm or less. The thinning may for example be performed by mechanical means like grinding and/or polishing, and/or by etching.

Next, material is selectively removed from the main wafer in a second material removal device 14, for example to contribute forming structures for a micro-electro-mechanical system, for example cavities, membranes, cantilevers, tongues or the like. In some embodiments, in second material removal device 14 also the filling material filled in filling device 11 may be removed.

As already mentioned, after second material removal device 14, further processing may occur in further devices. For example, a further carrier wafer may be bonded to the main wafer.

Figure 2:
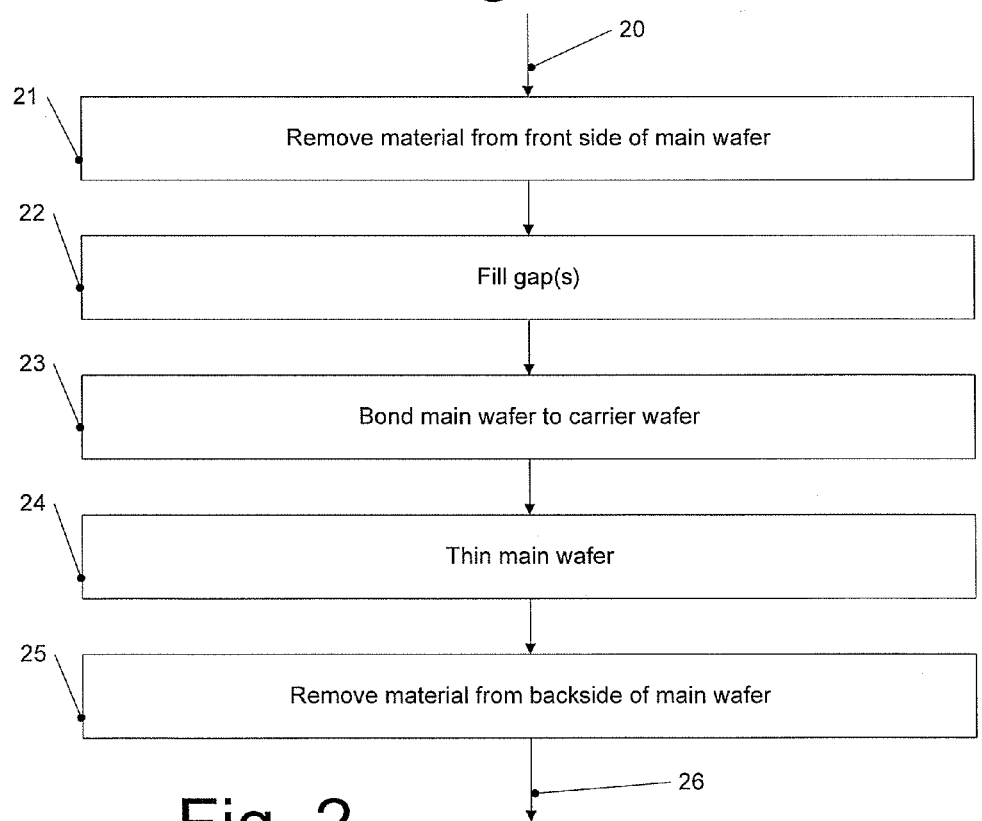
FIG. 2 is a flowchart illustrating a method according to an embodiment.

In FIG. 2, a flowchart illustrating a method according to an embodiment is illustrated. The method of FIG. 2 may be implemented using the apparatus illustrated and described with respect to FIG. 1, but may also be implemented independently therefrom. Modifications discussed with respect to the apparatus of FIG. 1 may also apply to the method of FIG. 2 discussed below and vice versa.

At 21, material is removed from a front side of the main wafer. A front side in embodiments may be a side of the main wafer where structures, in particular electrical structures, are formed, for example resistors or electrical contacts. As indicated by an arrow 20, such structures may be formed in prior processing before applying the method of FIG. 2, for example by employing conventional semiconductor processing techniques.

In some embodiments, material, for example part(s) of an epilayer and/or an oxide layer is removed at places where openings are to be provided through the main wafer in a micro-electro-mechanical system (MEMS) to be produced.

At 22, one or more gaps generated by the material removal at 21 may be filled with a temporary filling material which is intended to be removed again later. In some embodiments, the temporary material is selected to be removable by a dry process like a dry etching process or an oxygen ($O_2$) plasma, also referred to as oxygen flash. In some embodiments, a carbon-based material may be used as filling material.

At 23, the main wafer is bonded to a carrier wafer, for example a glass wafer. The bonding may take place at the front side of the main wafer and may be an irreversible bonding, for example anodic bonding.

At 24, the main wafer is thinned, for example from a back side of main wafer opposite to the front side. As the main wafer is bonded to the carrier wafer at 23, in some embodiments this may give sufficient stability and support to the main wafer for the thinning. In some embodiments, an original thickness of the main wafer may be between about 400 µm and about 725 µm, although other thicknesses may also apply. Through the thinning at 24, the main wafer is for example thinned to a thickness at or below 300 µm, at or below 100 µm, at or below 50 µm or even less.

At 25, material is removed from the backside of the main wafer, for example to form structures like cavities in the main wafer necessary for a functioning and/or forming of a mechanical part of the micro-electro-mechanical system to be formed. In some embodiments, at 25, additionally, the filling material filled at 22, is removed.

After 25, as indicated by an arrow 26, further processing may take place, for example a bonding of a further carrier wafer to the main wafer, for example at a backside thereof. Also the further carrier wafer may comprise a structured glass wafer, but is not limited thereto.

To further illustrate the apparatus of FIG. 1 and the method of FIG. 2, with respect to FIGS. 3A to 3K, a micro-electro-mechanical system in various stages of processing is shown. At least some of these stages may illustrate processing performed by the devices of FIG. 1 and/or processing using the method of FIG. 2. It is to be emphasized that these specific examples of FIGS. 3A to 3K are illustrative only and are not to be construed as limiting. For example, while the micro-electro-mechanical system illustrated with reference to FIG. 3A to 3K is a combined pressure and acceleration sensor, in other embodiments other kinds of micro-electro-mechanical devices may be formed, for example pure acceleration sensors, pure pressure sensors, or any other kinds of sensors, but not being limited to sensors. Examples for other micro-electro-mechanical systems may for example include gas sensors. In other embodiments, instead of a micro-electro-mechanical system other structures formed on a wafer, for example purely electrical devices, may be used.

Figure 3A:
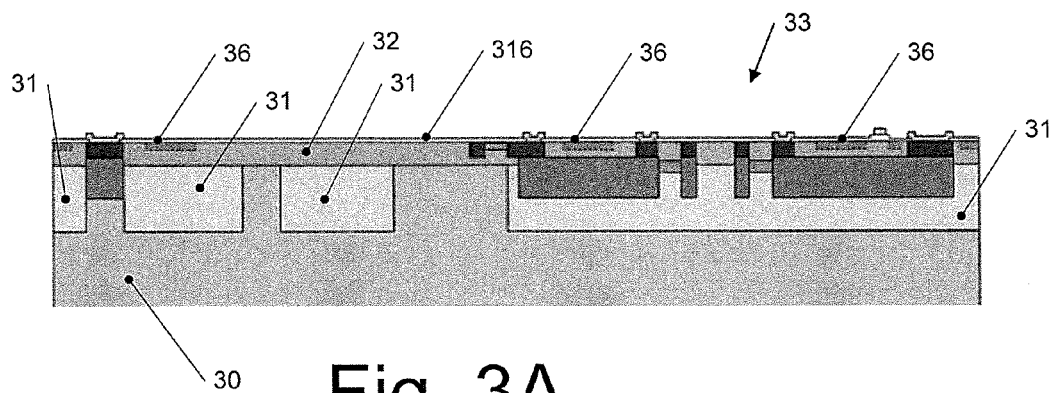
FIGS. 3A to 3H and 3J to 3K are schematic cross-sectional views of a device according to an embodiment in various stages of a manufacturing process thereof.

In FIG. 3A, a main wafer which has already undergone some processing is shown. The main wafer of FIG. 3 is an illustrative example for a main wafer which may be provided to first material removal device 10 of FIG. 1 as indicated by arrow 15 or provided to the method of FIG. 2 as indicated by arrow 20. The main wafer of FIG. 3 comprises a wafer body 30, for example made of silicon. Various structures as depicted in FIG. 3A are formed on a front side of the main wafer. To form these structures, conventional techniques like oxidation, lithography, etching, implantation, diffusion or epitaxy may be used. To give some examples, the main wafer of FIG. 3A comprises doped regions 31, for example boron-doped region, a region 33 where resistor structures are formed, an epitaxial layer 32, an oxide layer 316 on epitaxial layer 32, highly N-doped regions 36, metallizations or any other desired structures. The structures shown serve only as examples and may depend on the micro-electro-mechanical system to be manufactured. It should be noted that for ease of representation and for clarity's sake, in the following FIGS. 3B to 3K not all reference numerals shown in FIG. 3A are repeated, but only those reference numerals relevant to the explanation and illustration of a respective processing are shown.

Figure 3B:
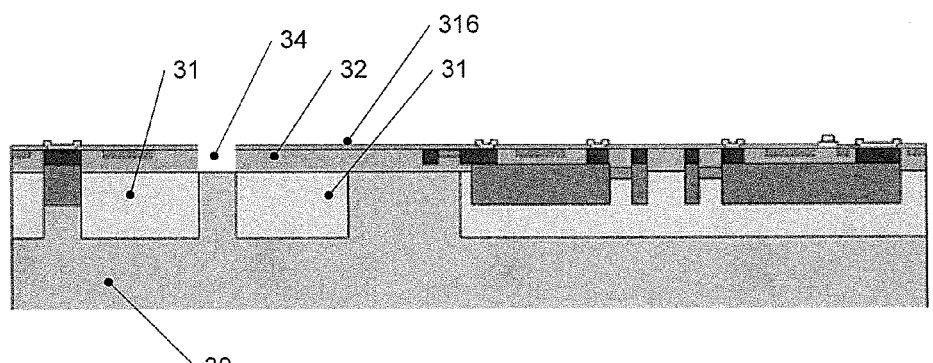

In FIG. 3B, the result of a material removal as for example performed in first material removal device 10 of FIG. 1 or at 21 of FIG. 2 is shown. In particular, a gap 34 in oxide layer 316 and in epitaxial layer 32 has been produced, for example by etching. In the example of FIG. 3B, the material removal has been performed at a location corresponding to a location between two doped regions 31 as shown. At this location, as will be seen later, it is intended to produce an opening to generate for example a tongue or a cantilever.

Figure 3C:
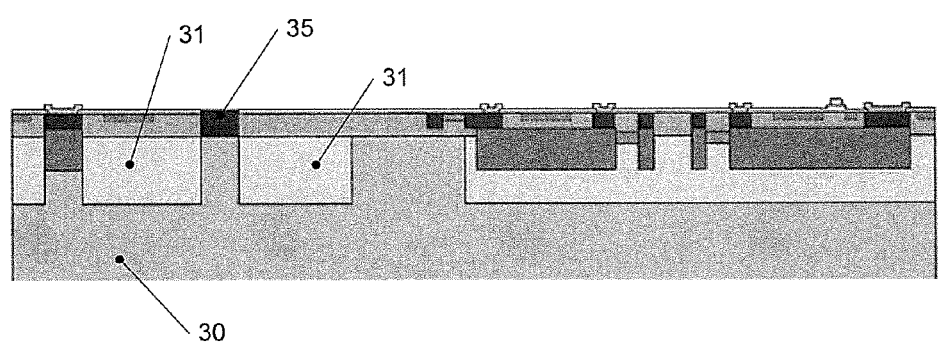

As illustrated in FIG. 3C, afterwards the gap 34 formed in FIG. 3B is filled again with a filling material 35 in FIG. 3C. This filling in embodiments may serve as a passivation and may protect the front side of the wafer for example against chemical substances which are used for structuring a backside of the wafer and which otherwise could enter cavities in a support wafer, as will be explained later in more detail.

Figure 3D:
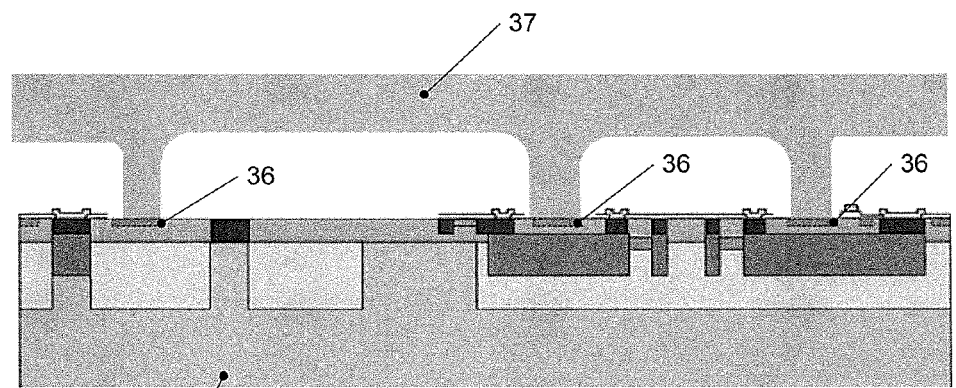
Figure 3E:
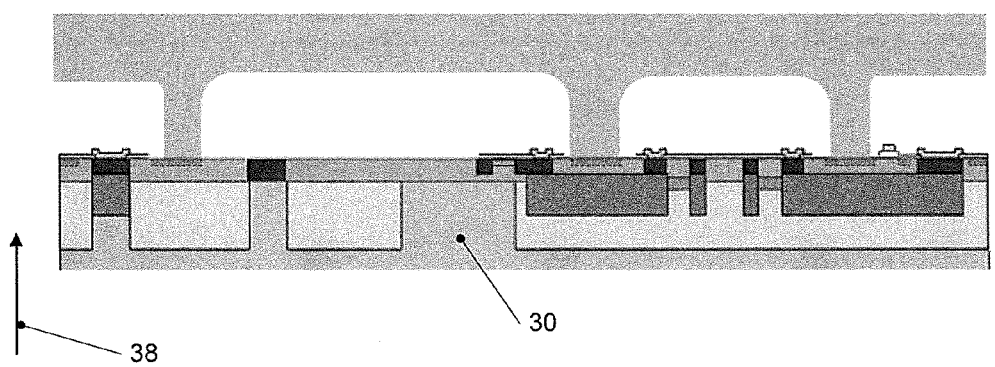

As filling material 35, in some embodiments a carbon-based material may be used, for example amorphous hydrogenated carbon (a-C:H) or diamond-like carbon (DLC). Alternative materials include photoresists or lacquers dissolvable via ultraviolet radiations or adhesives. Further examples for filling materials include doped or undoped silicon oxide, silicon nitride, silicon oxynitride, aluminum oxide, high-k dielectric or low-k dielectric materials. With such material, in some embodiments prior to filling the material in gap 34, a thin insolated oxide or nitride may be deposited which may serve as etch stop in later processing. Portions of the filling material or materials remaining outside gap 34 may for example be removed via lithography and etching. After this, as illustrated in FIG. 3D, a structured glass wafer 37 is bonded to the main wafer for example at N-doped portions 36. At the bonding locations, an oxide film which may be present on the main wafer may be removed. This bonding of structured glass substrate 37 is an example of a processing which may be performed in carrier wafer bonding device 12 or at 23 of FIG. 2 and may, for example, be performed by anodic bonding. In other embodiments, instead of a glass wafer other materials may be used. Moreover, in other embodiments instead of anodic bonding other bonding techniques, in particular irreversible bonding techniques, may be used. Glass wafer 37 in subsequent processing steps may serve as a permanent irreversible carrier supporting the main wafer.

Glass wafer 37, besides providing support for the main wafer, in some embodiments also protects the front side, for example against scratches, inducing the effect and contamination through processing devices, environment, chemical substances or the like.

This support provided by glass wafer 37 may then for example be used for thinning the wafer. As indicating by an arrow 38 in FIG. 3E, the wafer body 30 of the main wafer may be thinned, for example to a thickness below 300 µm, below 100 µm or below 50 µm. Essentially, any thickness may be used with which, within a precision of the thinning process used, ensures that the structures formed at the front side of the main wafer are not damaged by the thinning. For example, with some techniques, only about 3 µm or about 5 µm wafer body thickness above the structures formed, for example above doped regions 31, may remain. The thinning may be performed using conventional grinding, polishing and/or etching techniques.

Figure 3F:
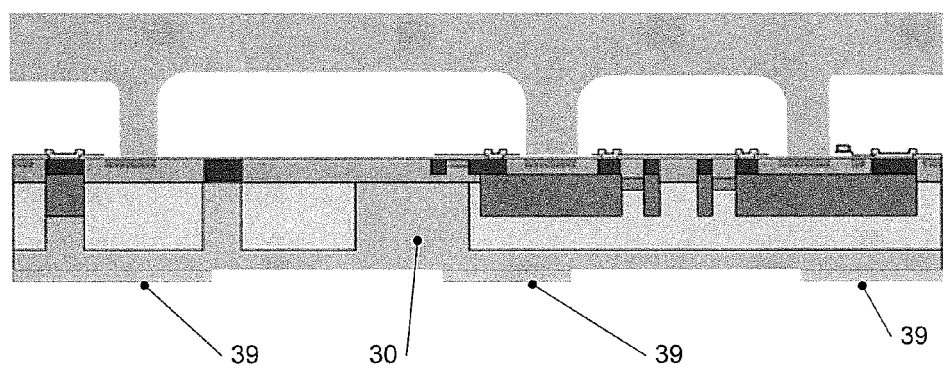

After this, in embodiments to prepare for a material removal from the backside of the main wafer, a mask 39 for a subsequent etching is generated, as shown in FIG. 3F. The mask 39 may be deposited using conventional techniques, for example chemical vapor deposition (CVD) techniques. In embodiments, though providing an irreversible bonding, like an anodic bonding, the bonding does not limit the possible temperatures for the deposition of mask 39. Such temperatures may for example be up to 550° C. in embodiments and are limited essentially by the structures formed in the main wafer, for example a front side metallization. This is in contrast to conventional approaches for handling thin wafers involving the use of a carrier and an adhesive for mounting the wafer to the carrier. In such conventional approaches, the temperature for subsequent treatments is limited by a temperature stability of the adhesive, which may be considerably lower than 400° C.

Figure 3G:
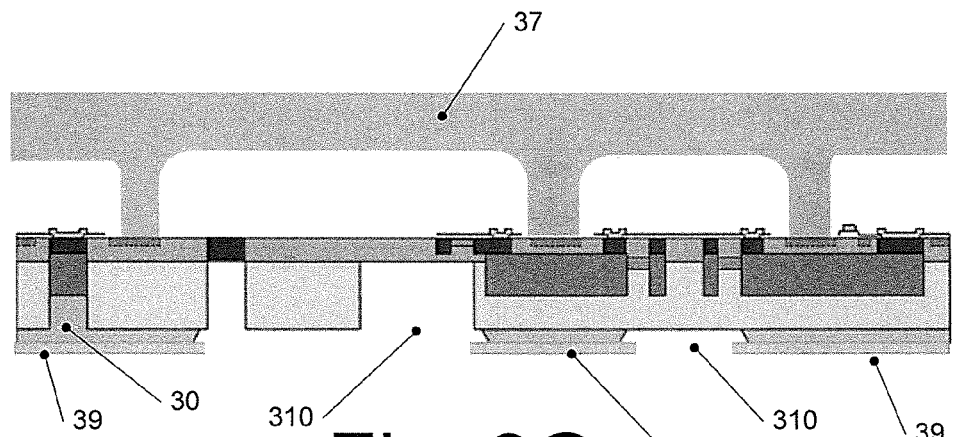

Subsequently, an etching is performed. The result for the example of FIG. 3 is shown in FIG. 3G. In particular, an etching sensitive to a doping concentration, also referred to as PN-etching, may be used which e.g. leaves p-doped regions 31 unetched. For such an etching conventional approaches may be used, for example an approach where the front side of the main wafer is contacted. For such a contacting, contact holes (not shown in FIG. 3) may be provided in glass wafer 37. As the thickness of the wafer body 30 has been reduced previously, etching times may be reduced, compared to cases of thick wafers. Moreover, due to reduced etching depths underetching under mask 39 and space needed for etch flanks may be reduced, which may reduce a required chip area which in turn may lead to an increase of the integration density in some embodiments. The etching leads to spaces or cavities 310 absent material.

Figure 3H:
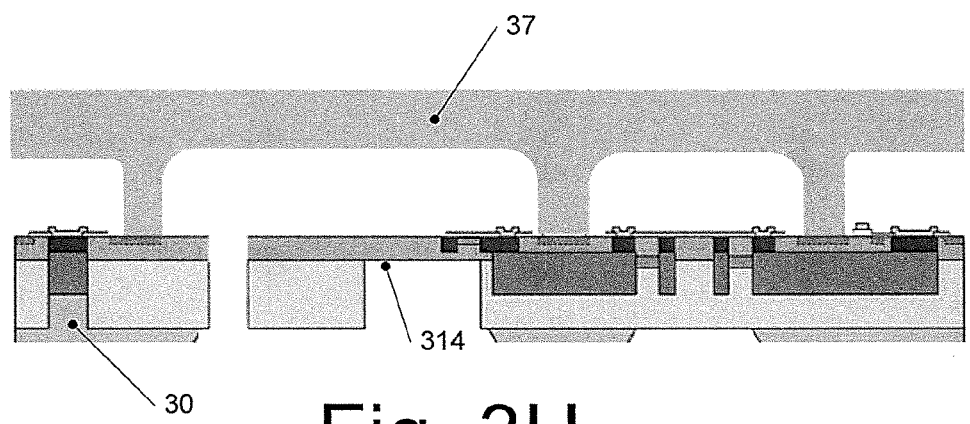

Subsequently, the filling material 35 filled in the gap as illustrated and explained with reference to FIG. 3C is removed again, leading to the situation as illustrated in FIG. 3H. Also, mask 39 is removed. The removal of the filling material may in particular may be performed by a dry removal method like providing an oxygen plasma in case of carbon-based material. This in embodiments prevents liquids from entering cavities of glass wafer 37.

This results in a tongue or cantilever 314 being "freed", such that tongue 314 may for example be used as sensing element of an acceleration sensor.

The processes illustrated and explained with reference to FIGS. 3F to 3H may for example be performed using second material removal device 14 of the apparatus of FIG. 1 or may be performed at 25 of FIG. 2.

Figure 3J:
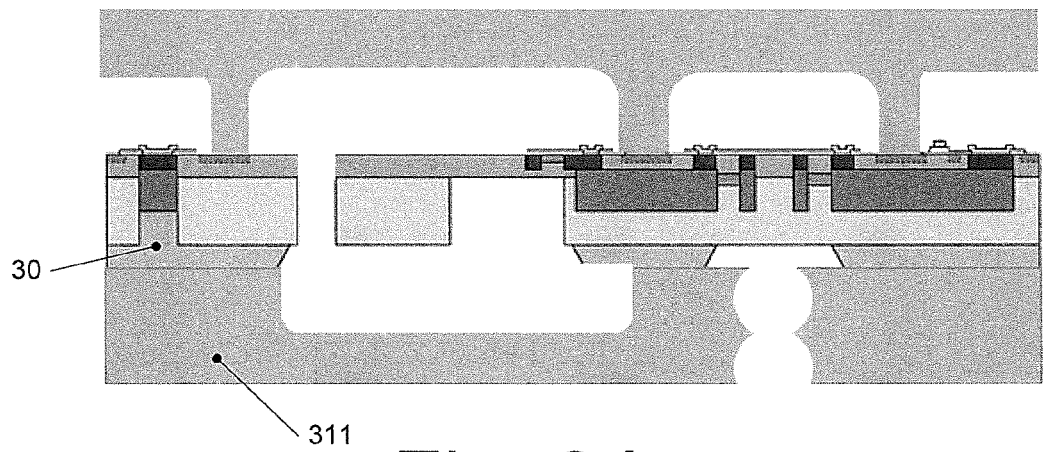
Figure 3K:
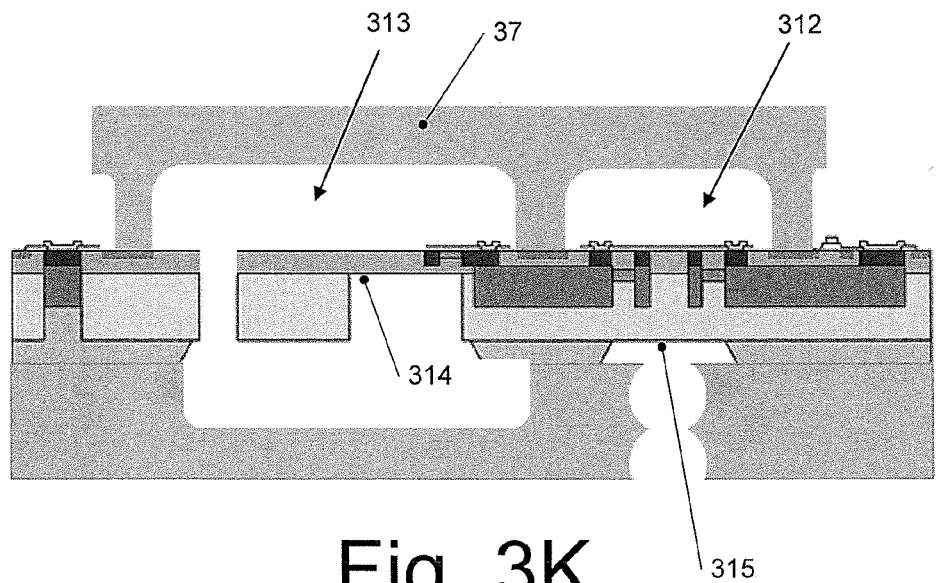

Subsequently, in some embodiments, an additional glass carrier wafer 311 as illustrated in FIG. 3J may be bonded to the backside of the main wafer, for example again using again anodic bonding. Afterwards, as illustrated to some extent in FIG. 3K, further processing steps like laminating, bridge-cut sawing, cleaning, visual and quality control or dicing may be performed to form individual devices as shown in FIG. 3K. In the example of FIG. 3K, essentially an acceleration sensor using tongue 314 as generally indicated by reference numeral 313 and a pressure sensor using a membrane 315 as generally indicated by reference numeral 312 may be formed. As already mentioned, this serves only as an example, and in other embodiments other kinds of sensors or other kinds of micro-electro-mechanical systems may be formed. Generally, the processing illustrated with reference to FIGS. 3J and 3K represents an example for processing after second material removal device 14 of FIG. 1 (as illustrated by an arrow 16) or after 25 of FIG. 2 (as illustrated by arrow 26).

In the example discussed above, in particular with respect to FIG. 3C, a filling material like a carbon-based material 35 was used to fill a gap 34 formed at a front side of a wafer. This serves to ensure formation of an opening (as shown in FIG. 3H), and by using a dry process for removal of the filling material in embodiments it is ensured that no liquid enters a cavity of glass wafer 37. In other embodiments, other filling materials, for example doped or undoped silicon oxide, silicon nitride, silicon oxynitride, aluminum oxide, high-k dielectric or low-k dielectric materials may be used. In other embodiments, other approaches may be used, some of which will now be discussed with reference to FIGS. 4A and 4B.

Figure 4A:
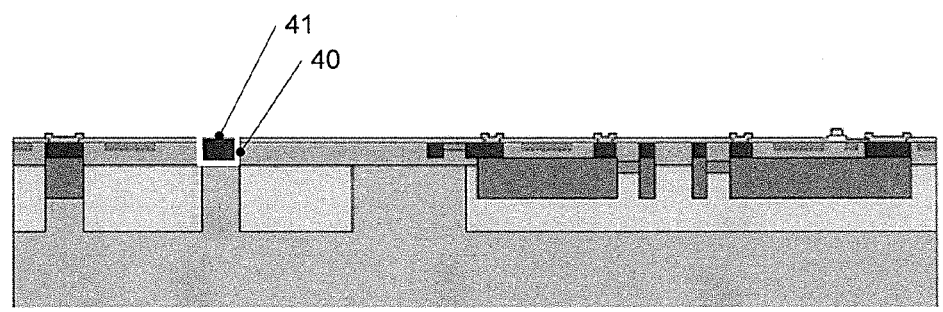
FIGS. 4A and 4B are schematic cross-sectional views illustrating alternative manufacturing techniques.

In the alternative of FIG. 4A, instead of merely filling a carbon-based material into gap 34 of FIG. 3B, a thin oxide layer 40 is deposited prior to filling the gap with a carbon-based material 41 or any other suitable material as discussed in FIG. 3C. In some embodiments, oxide layer 40 may provide a better etch stop, for example for the etching process illustrated with reference to FIG. 3G.

Figure 4B:
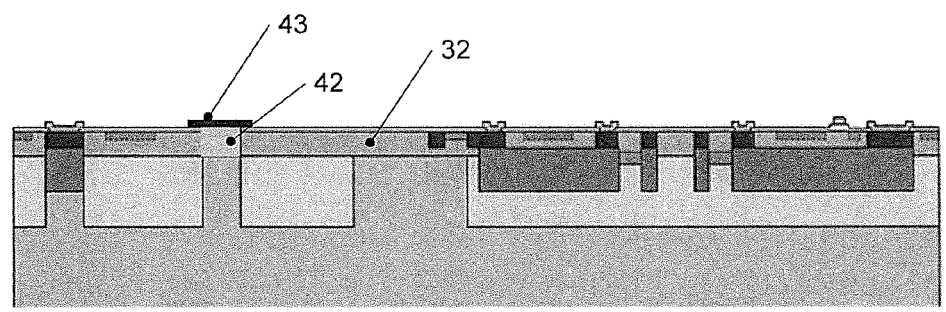

A further alternative is shown in FIG. 4B. Here, prior to depositing epilayer 32, an oxide material block 42 is structured on the main wafer at the location of the gap 34. At oxide material block 42 then during deposition of epilayer 32 essentially no growth occurs. In this case, no material removal as illustrated in FIG. 3B has to be performed. In some embodiments, a carbon-based layer 43 may then be deposited on top of oxide 42 for passivation. For a material removal corresponding to what was described with reference to FIG. 3H, at first oxide 42 may be removed for example by etching, e.g. wet etching, and then carbon passivation 43 may be removed for example by an oxygen plasma.

Other techniques for filling gap 34 or for providing material which can easily be removed later to provide openings through the substrate without filling a cavity of glass wafer 37 with liquid may also be used.

Through the thinning of the main wafer as described above, in some embodiments, space within a package may be saved. In some embodiments, this may be used for stacking a further device on top of the micro-electro-mechanical system. A device according to an embodiment implementing this is schematically shown in FIG. 5.

Figure 5:
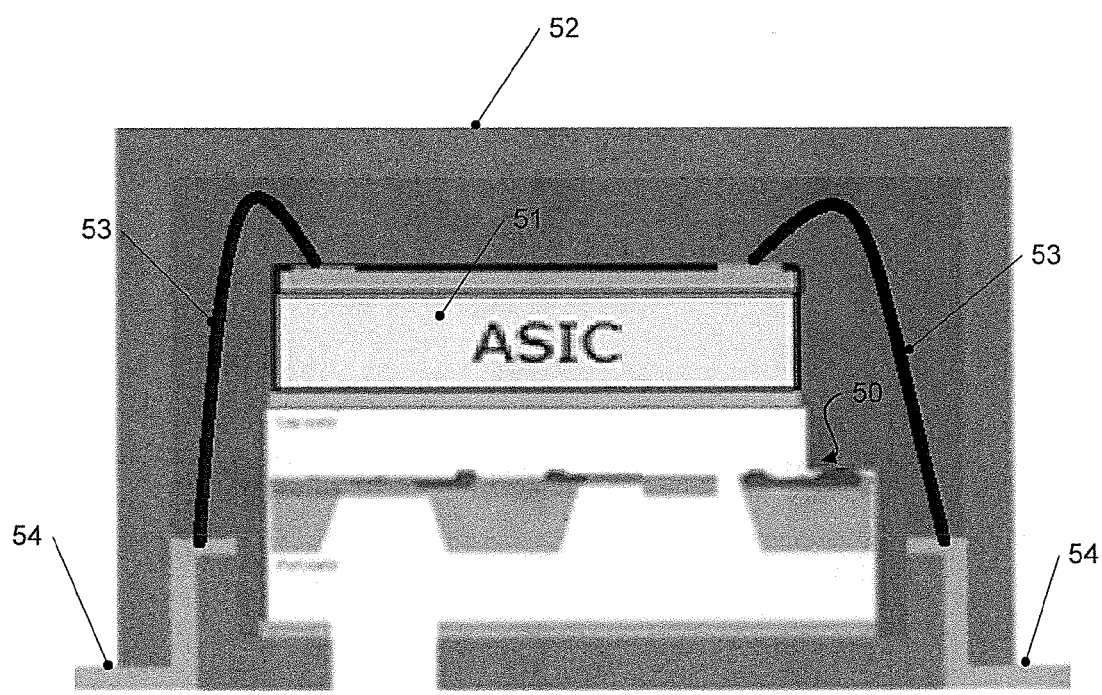
FIG. 5 is a schematic cross-sectional view of a device according to an embodiment.

In FIG. 5, within a package 52, a micro-electro-mechanical system 50, for example manufactured as explained with respect to the embodiments of FIGS. 1 to 4B, is provided. Micro-electro-mechanical system 50 may for example comprise a pressure sensor and/or an acceleration sensor. On top of micro-electro-mechanical system 50, an application specific integrated circuit (ASIC) 51, for example designed to evaluate signals from micro-electro-mechanical system 50, is placed. In conventional approaches with thicker main wafers, conventionally it was often only possible to place ASIC 51 besides the micro-electro-mechanical system. ASIC 51 is coupled via bonds 53 with external contacts 54. With the approach of FIG. 5, in some embodiments compact sensor devices may be provided.

It is to be emphasized again that the embodiments discussed above serve only as examples and are not to be construed as limiting. Rather, the described embodiments serve to give a better understanding of some possibilities for implementation of the techniques described herein.

What is claimed is:

1. A method, comprising:
   irreversibly bonding a semiconductor main wafer to a glass carrier wafer at a front side of the semiconductor main wafer,
   thinning the semiconductor main wafer from a back side of the semiconductor main wafer,
   selectively removing material from the back side of the semiconductor main wafer,
   irreversibly bonding an additional glass carrier wafer at the back side of the semiconductor main wafer,
   wherein the glass carrier wafer and the additional glass carrier wafer are directly bonded to the main wafer.

2. The method of claim 1, further comprising a forming a micro-electro-mechanical system in the main wafer.

3. The method of claim 1, wherein the irreversibly bonding of the semiconductor main wafer to the glass carrier wafer at the front side of the semiconductor main wafer comprises an anodic bonding.

4. The method of claim 1, further comprising, prior to bonding the main wafer to the carrier wafer, selectively removing material from the front side of the main wafer at one or more locations to form one or more gaps where holes are to be formed through the main wafer.

5. The method of claim 4, further comprising filling the one or more gaps formed by the removal of the material from the front side of the main wafer with a filling material.

6. The method of claim 5, wherein the filling material comprises a carbon-based material.

7. The method of claim 5, wherein the filling material comprises an oxide.

8. The method of claim 5, wherein selectively removing material from the back side of the main wafer comprises removing the filling material.

9. The method of claim 8, wherein removing the filling material comprises performing a dry process.

10. The method of claim 1, further comprising, prior to the bonding of the main wafer to the carrier wafer, providing a material block on a front side of the main wafer at a location where a hole is to be formed through the main wafer.

11. The method of claim 1, wherein the glass carrier wafer covers a majority of the front side of the semiconductor main wafer, and the additional glass carrier wafer covers a majority of the back side of the semiconductor main wafer.

* * * * *